United States Patent
Goto et al.

(10) Patent No.: US 6,873,167 B2
(45) Date of Patent: Mar. 29, 2005

(54) CONNECTION BOX, SYSTEM, AND METHOD FOR EVALUATING A DUT BOARD

(75) Inventors: Akihiko Goto, Tokyo (JP); Yuko Iwasaki, Tokyo (JP); Tsuyoshi Tanaka, Kanagawa (JP); Koji Tokuno, Tokyo (JP)

(73) Assignee: Agilent Technologies, Inc., Palo Alto, CA (US)

( * ) Notice: Subject to any disclaimer, the term of this patent is extended or adjusted under 35 U.S.C. 154(b) by 122 days.

(21) Appl. No.: 10/279,519

(22) Filed: Oct. 24, 2002

(65) Prior Publication Data

US 2003/0082936 A1 May 1, 2003

(30) Foreign Application Priority Data

Oct. 25, 2001 (JP) .................................. 2001-327529

(51) Int. Cl.[7] .............................................. G01R 31/02
(52) U.S. Cl. .................................... 324/754; 324/755
(58) Field of Search ................................ 324/765, 754, 324/755, 158.1, 758, 761, 757; 439/482, 700, 581, 330, 310, 311; 364/481, 551

(56) References Cited

U.S. PATENT DOCUMENTS

| | | | | |
|---|---|---|---|---|
| 4,425,542 A | * | 1/1984 | Tsaliovich et al. .......... 324/627 |
| 4,686,628 A | * | 8/1987 | Lee et al. .................... 702/117 |
| 5,241,277 A | * | 8/1993 | Kefalas ....................... 324/538 |
| 5,295,853 A | | 3/1994 | Nagakusa .................... 439/330 |
| 5,506,510 A | * | 4/1996 | Blumenau .................... 324/754 |
| 5,546,405 A | * | 8/1996 | Golla .......................... 714/724 |
| 5,790,411 A | * | 8/1998 | Nelson ........................ 714/726 |
| 6,218,848 B1 | * | 4/2001 | Hembree et al. ............ 324/754 |

FOREIGN PATENT DOCUMENTS

| | | |
|---|---|---|
| JP | 01-295183 | 11/1989 |
| JP | 04-282472 | 10/1992 |
| JP | 06-249913 | 9/1994 |
| JP | 2000-356651 | 12/2000 |
| JP | 2001-228173 | 8/2001 |

* cited by examiner

*Primary Examiner*—Evan Pert
*Assistant Examiner*—Jimmy Nguyen

(57) ABSTRACT

An evaluation device and method for DUT boards and probe cards which increase the reproducibility of the measured values and decrease the abrasion of pads in evaluation tests. A connection box is provided with contact pins, mounting mechanisms used to mount the DUT boards, and a plurality of connectors which feed signals from the contact pins to the outside.

16 Claims, 7 Drawing Sheets

CONNECTION BOX, SYSTEM, AND METHOD FOR EVALUATING A DUT BOARD

BACKGROUND OF THE INVENTION

1. Field of the Invention

This invention concerns a DUT board which is mounted on the test head of a semiconductor tester, as well as a device and a method for evaluating probe cards.

2. Discussion of the Related Art

There are various kinds of semiconductor testers, including semiconductor parametric testers, which measure the parametric properties of semiconductors formed on integrated circuits to IC testers which perform functional and performance tests of ICs. They perform 2 types of measurements: measurements in the wafer state, using a wafer prober, and measurements performed on packaged integrated circuits. When these measurements are performed, the wafer measurements and packaged integrated circuit measurements are performed by preparing a DUT board mounted on a test head for each DUT. Furthermore, the DUT boards used in the wafer measurements are called "probe cards." As described, for example, in Japan Patent Publication No. 2001-228,173, a hole for confirming positions during probing is provided in the center of the card and probe needles for probing are placed on the periphery of this hole. As described in Japan Patent Publication No. 2001-228,173, in order to make contact with the plurality of contact pins placed on the test head, a plurality of contact terminals, that is, pads, are placed on the DUT board in positions which correspond to the arrangement of the contact pins. Conductive patterns are formed on the DUT board from these pads to the positions at which the parts, such as cables, ICs, and sockets, are placed, conforming to the DUT being tested.

Concerning the number of pads on this DUT board, in the case of the semiconductor parametric testers of the Agilent 4070 Series, for example, there are 48 channels, and 3 contact pins (a sense pin, force pin, and a guard pin are formed for each channel); therefore, 144 pads are provided. Furthermore, in the case of multi-channel IC testers, 500 to 1000 channels are formed, and the number of pads for these channels is quite large, even if only 1 contact pin is formed for each channel.

In quality evaluation tests of DUT boards, up to now, connection tests to investigate the connection relationships for each terminal and insulation resistance tests of the most critical parts, e.g., between terminals with narrow pattern gaps, were performed. The measurements were performed by using an insulation resistance meter, such as an Agilent 4339; the operator performed the measurements by hand, by using terminals such as banana plugs, which were put into contact with the pads of the blank board and the holes for mounting parts.

This kind of method, however, had various kinds of problems: the reproducibility of the measured values was poor, since the state of the connection was not constant, and the hand operation took considerable time, since several tens of measurements or more were made. Furthermore, when suspicious values were obtained the measurements were done over, so that in some cases contacts were made several times with each pad, causing abrasion of the pads. Furthermore, DUT boards in recent years required measurements of very small currents, on the fA (femtoampere, $10^{-15}$ ampere) order, and methods for measuring and evaluating the resistance performances of such DUT boards have been demanded which suppress errors due to current leaks and have good reproducibilities.

SUMMARY OF THE INVENTION

With regard to the problems mentioned above, the purpose of this invention is to provide a device and a method for evaluating DUT boards and probe cards by which measurements can be performed with good reproducibility and the abrasion of the pads in the evaluation tests can be reduced.

Another purpose of this invention is to provide a device and a method for evaluating DUT boards and probe cards which are suitable for performing tests in which very small currents are measured.

Still another purpose of this invention is to provide a device and a method for evaluation by means of which retesting, when necessary, can be performed easily.

The inventors realized that, in the conventional measurement methods, the fact that the operator put terminals such as banana plugs into contact with the flat pads on the DUT boards by hand made the contacts unstable and cause poor reproducibility of the measurement values, and that this was a troublesome procedure, requiring time for measuring many pads. In order to improve these aspects, they focused on the mechanism of the test head used in mounting the DUT boards. That is, they improved the reproducibility of the measurement values by providing a plurality of contact pins and a DUT board mounting mechanism. By connecting the contact pins with the respective connectors by means of cables, it became possible to transmit signals from the contact pins with low current leakage, and it was possible to perform the connection with the measuring device by an operation of changing the connections of the cables with the connectors, so that the operating time was also reduced. Based on these findings, they formed the idea of the connection box of this invention.

Furthermore, the inventors addressed the problem of making possible measurements of currents on the fA order. They observed that the objects of measurements were contaminated by adhesion of dirt or perspiration due to the operator's touching the contacts, resulting in increased current leakage, and the measurements could not be performed accurately because of the effects of external noise. As measure for solving these problems, the inventors made the connection box such that a fixture for covering the top of the DUT board could be mounted on it. In this way these problems, were solved, and it also became possible to evaluate very small current properties on the fA order, which was difficult to do with the conventional method of evaluating DUT boards.

As mentioned above, a connection box is provided in this invention which has a plurality of contact pins, a mounting mechanism for mounting DUT boards, and a plurality of connectors which are connected to the aforementioned plurality of contact pins and feed signals from the contact pins to the outside.

This connection box also has a fixture which covers the top of the DUT board. Furthermore, the connectors have a form in which their outer conductors are grounded by triaxial connectors. Short-circuiting means or short-circuiting caps are also mounted on the connectors in order to selectively short-circuit these connectors. The fact that these short-circuiting means can be mounted on the connection box makes it possible to take measures which were not possible with the conventional hand operation, using banana plugs, etc. That is, since the potentials of the pads of the channels adjacent to the pads of the channels being measured on the DUT box can be kept constant, it is possible to prevent noise from being mixed into the channels being measured, which contributes to measurements which are accurate and have good reproducibility.

Furthermore, in another embodiment of this invention, an evaluation system in which a measuring device is connected to the connectors of the aforementioned connection box and a method of evaluation which uses this system are provided. That is, in this measurement system, several of the connectors of the aforementioned connection box are connected to the measuring device. This also includes a form of this invention in which short-circuiting means are connected to the connectors which are not connected to the measuring device, and a switch matrix is placed between the connection box and the measuring device; this switch box is controlled from the measuring device, and suitable connections are formed with the connectors when the measurements are performed. This includes forms of the invention in which the operator indicates the desired connections to the switch matrix from the measuring device by a manual operation, as well as forms in which the switch matrix is controlled according to a program loaded into the measuring device, so that the connections are made automatically. Furthermore, the invention also includes a form in which a controller such as a personal computer is used for controlling the measuring device and the switch matrix. The measurement devices include ones with the capabilities of applying voltages and measuring currents and ones for measuring insulating resistances.

Furthermore, this invention provides a method of evaluation using this evaluation system which includes a step in which a DUT board is mounted on a connection box, a step in which the channels of the measuring device for measuring and evaluating DUT boards are connected to the connectors of the aforementioned connection box, and a step in which the connections of the aforementioned measurement device and the connectors of the aforementioned connection box are changed and the measurement by the aforementioned measuring device is repeated.

Another embodiment provides a method of evaluation which includes a step in which the device for measuring and evaluating DUT boards is connected to the switch matrix and said switch matrix is connected to the connection box, a step in which a DUT board is mounted on the aforementioned connection box, and a step in which the desired connectors of the aforementioned connection box are connected by controlling the aforementioned switch matrix and the measurements by the aforementioned measuring device are repeated.

Since repeated evaluations can be performed by these evaluation methods with all of the pads of the DUT board connected to the contact pins in 1 operation, this invention contributes to reducing the abrasion of the pads in evaluation tests, compared with the prior art.

DETAILED DESCRIPTION OF THE INVENTION

Figure 1A:
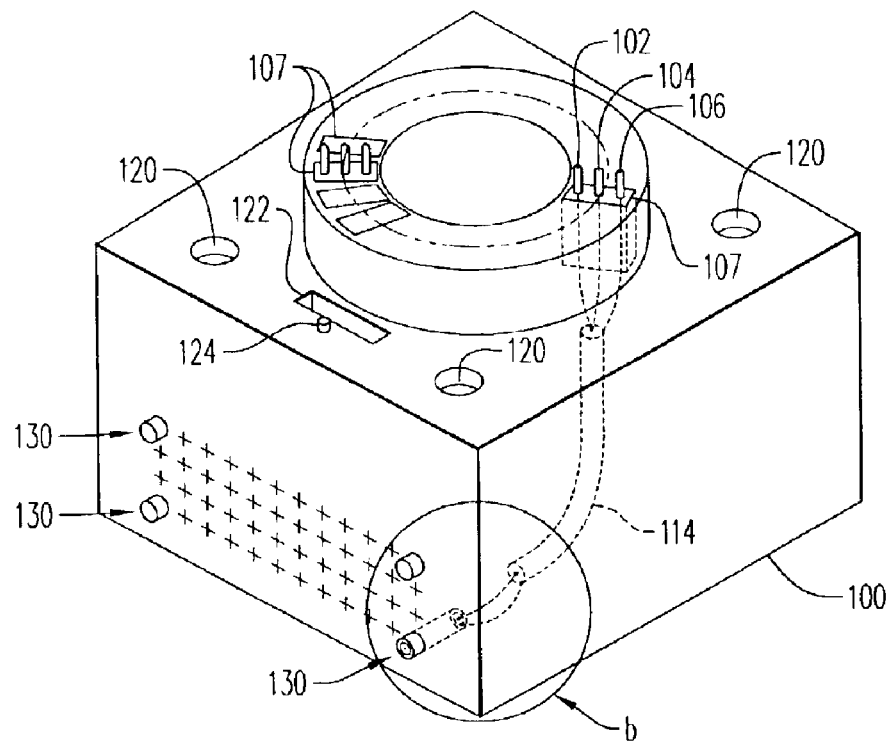
FIG. 1 is a transparent drawing showing a connection box, which is one working embodiment of this invention.

This invention will be explained below by giving a probe card as an example of a working embodiment of this invention. FIG. 1(a) shows a connection box 100 which is a working embodiment of this invention. Forty-eight pin assemblies 107 are arranged in a circular form on the top of the connection box 100; each pin assembly 107 includes a sense pin 102, a force pin 104, and a guard pin 106.

Furthermore, in this invention, the DUT board being evaluated may be in a state before the parts are mounted, a state in which some of the parts are mounted, or a state in which the mounting of the parts is completed and it is ready to be used as a DUT board, depending on the nature of the evaluation to be performed; it is not limited to any of these states in particular.

This invention includes various forms, including ones in which the number of pin assemblies is fewer or more than the number given above; the arrangement of the pin assemblies is circular, rectangular, or other shapes; and the pin assemblies are placed all around the circumference, or on only part of it; etc.

In addition, four guide holes 120 for mounting the DUT boards, two guide pins 124 for adjusting heights (only 1 shown in the drawing), and 2 grooves 122 for engaging cams (only 1 shown in the drawing) are placed on the top of the connection box 100; these are used when the DUT boards are mounted.

Forty-eight connectors 130, in four rows of twelve columns, are arranged on one side of the connection box 100. These connectors are triaxial connectors, that is, double coaxial connectors; they are connected to the 48 pin assemblies 107. As shown in FIGS. 1(a) and (b), signal lines from the sense pin 102 and the force pin 104 of teach pin assembly are connected together at the outlet of the pin assemblies 107 and they are connected to the central conductor or central contact 108 in the triaxial connector 130, through the core of the coaxial cable 114. The signal line from the guard pin 106 is connected to the outer conductor of the coaxial cable 114 at the outlet of the pin assemblies 107, and this is connected to the middle conductor or inner shell 110 of the triaxial connector 130 through the coaxial cable 114. The outer conductor or outer shell 112 of the triaxial connector 130 is connected to the grounded chassis of the connection box 100. Furthermore, the triaxial connectors used may be previously known technology, such as that described in Japan Patent Publication No. Hei 6[1994]-249,913.

Figure 1B:
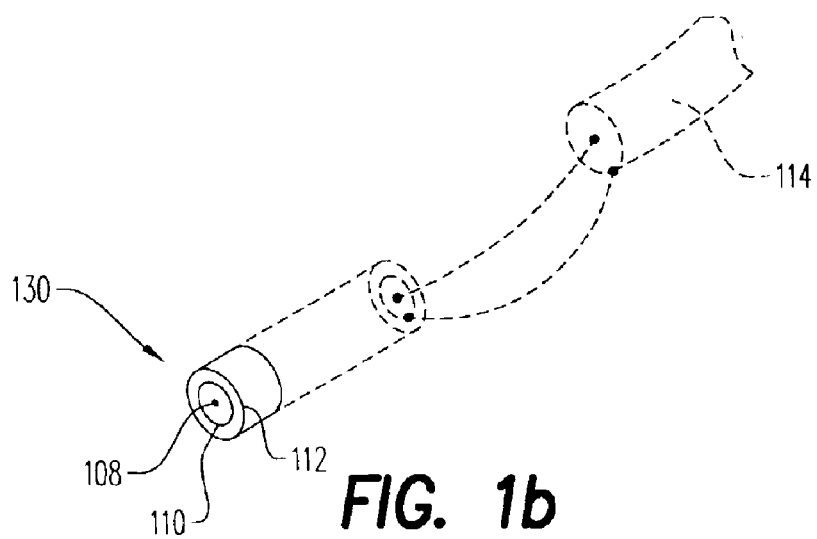
Figure 7A:
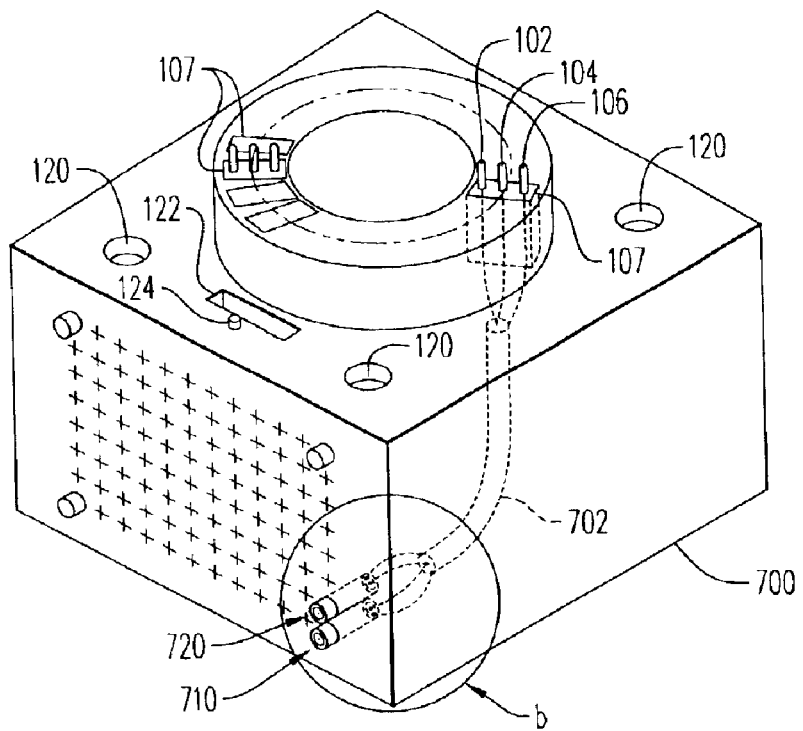
FIG. 7 is transparent drawing showing a connection box, which is another working embodiment of this invention.
Figure 7B:
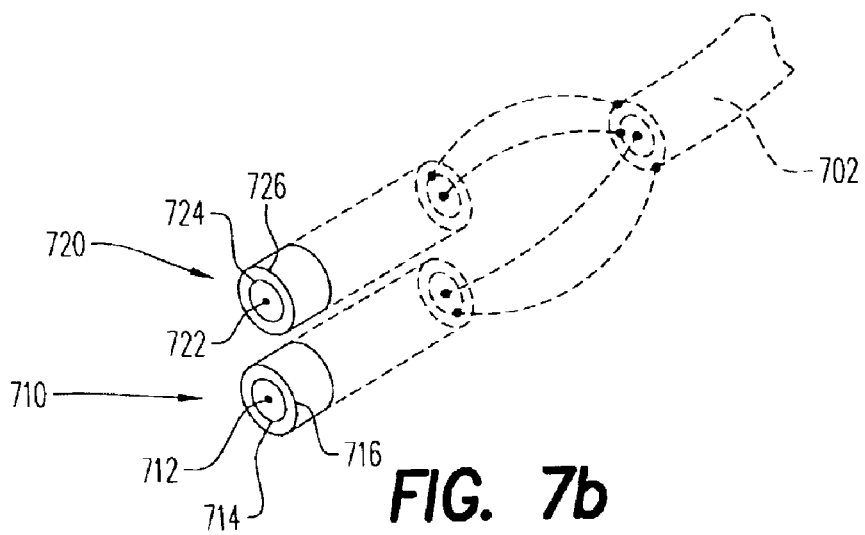

FIGS. 7(a) and (b) show another working embodiment of this invention. In FIG. 1, the force signal from the force pin 104 and the sense signal from the sense pin 102 are connected at the outlet of the pin assembly 107, and a coaxial cable 140 is used; therefore, a Kelvin connection was not maintained up to the triaxial connector. In the connection box 700 in the embodiment shown in FIG. 7, the triaxial cables such as those described in Japan Patent Publication No. Hei 6[1994]-249,913, that is, double coaxial cables 702 are used. Two triaxial connectors are connected to one cable; by this means, a Kelvin connection can be realized in the whole signal pathway from the connector to the DUT board. That is, the signal line from the force pin 104 is connected to the central conductor 722 of the triaxial force connector 720 through the middle conductor of the triaxial cable 702; the signal line from the sense pin 102 is connected to the central conductor 712 of the triaxial sense connector 710 through the core wire of the triaxial cable 702; the signal line from the guard pin 106 is connected to both the middle conductor 714 of the force connector 720 and the middle conductor 724 of the sense connector 710 through the outer conductor of the triaxial cable 702; and the outer conductor 716 of the force connector 720 and the outer conductor 726 of the sense connector 710 are both connected to the grounded chassis of the connection box 700. As is clear from this explanation, a total of 96 triaxial connectors, 48 force connectors and 48 sense connectors, are placed on the connection box. Furthermore, the other parts in FIG. 7 are the same as in FIG. 1; therefore, they are not explained. In addition, persons skilled in the art will no doubt be able to employ various embodiments, using publicly known connectors and cables and increasing or decreasing the number of terminals of the pin assemblies. As an example, the triaxial cable 702 of FIG. 7 may be replaced by a shielded 2-core cable, which can be obtained as a shielded junfuron cable for wiring devices made by the Junkosha, Inc.

In the explanation below, the explanation will be continued by using the connection box 100 explained in FIG. 1 as an example, but this is used for illustration only; one could of course use the connection box 700 instead of the connection box 100 in the following explanation.

Next, the method of connecting the connection box 100 and the DUT board will be explained by means of FIG. 2, using the attachment of a probe card as the example. To attach the probe card on the connection box 100, the probe card 202 is first attached in the attachment position (not shown) inside the fixture 204 by publicly known methods such as screwing, and the probe card 202 is connected to the contact pins of the connection box 100 by mounting the fixture 204 on the connection box 100.

The fixture covers the top of the probe card 202, preventing external noise from affecting the measurement results; in addition, it shields the operator from the danger of the application of high voltages of 40 volts or higher. The fixture is provided with four positioning guide rods 206 and two guide holes (not shown) corresponding to the guide pins, as well as two cams 208 provided with levers 210. When the fixture 204 is mounted on the connection box, the fixture 204 is lowered onto the top of the connection box in such a way that the positions of the guide holes 120 and the guide pins 124 coincide, and after the bottoms of the cams 206 are inserted into the engaging grooves 122, the levers 210 are pushed to the opposite sides, engaging the engaging mechanism of the grooves 122 and the cams and completing the mounting. Furthermore, the engaging mechanism using cams which is used in this invention employs a publicly known mechanism such as that shown in Japan Patent Publication No. Hei 1[1989]-295,183.

In this invention, the probe card is fastened to a box-shaped fixture which covers the top of the probe card, and the fixture is mounted on the connection box, but various other forms of mounting mechanisms not shown in the drawings may also be employed. For example, the probe card may be replaced by a DUT board, and the DUT board may be directly mounted on the connection box, as in the method of mounting DUT boards and test heads described in Japan Patent Publication No. Hei 4[1992]-282,472.

In order to prevent high voltages, such as static charges, being applied to the cables or pads of those channels among the connectors 130 which are not connected from the probe card 202 to the measuring device 302, or to prevent the voltages being changed by floating capacities, triaxial short-circuiting caps 214 are connected to the connectors 130 where necessary. These short-circuiting caps short-circuit the central conductors 108, the middle conductors 110, and the outer conductors 112. In this invention, moreover, one can use other forms of short-circuiting means. In the measurement method of the prior art, in which a hand operation was performed using banana plugs, noise became mixed in with the signals during the measurements because there was no means of keeping the potentials of the pads of the channels adjacent to the pads of the channels being measured constant, but this effect can be eliminated by the method of this invention.

By using a connection box 100 of this kind, the probe card 202 can be connected securely to the connectors 130, increasing the reproducibility of the measured values. Moreover, since it is possible to perform repeated measurements by connecting various measuring devices to the connectors while the probe card is mounted, the pads of the probe card are abraded only once, compared with the prior art, which contributes to reducing the abrasion of the pads during evaluation tests. Furthermore, considering the workability for the operator, the time of the operation is reduced, since the connection with the measuring device is changed to connecting and disconnecting the cables to the connectors 130. Furthermore, with this connection box, the contact pins and the connectors are connected by shielded cables; therefore, current leakage in the connection box can be completely suppressed. Therefore, highly accurate measurements of currents on the fA order is possible.

Figure 3:
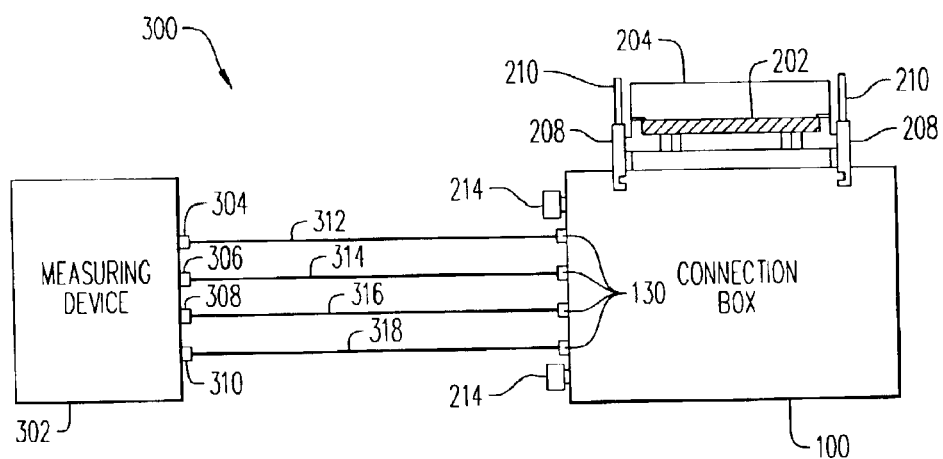
FIG. 3 is a block drawing of an evaluation system which is another working embodiment of this invention.

Next, the evaluation of the probe card 202 using a measuring device and connection box, which is another working embodiment of this invention, will be explained by using FIGS. 3 and 4.

Figure 2:
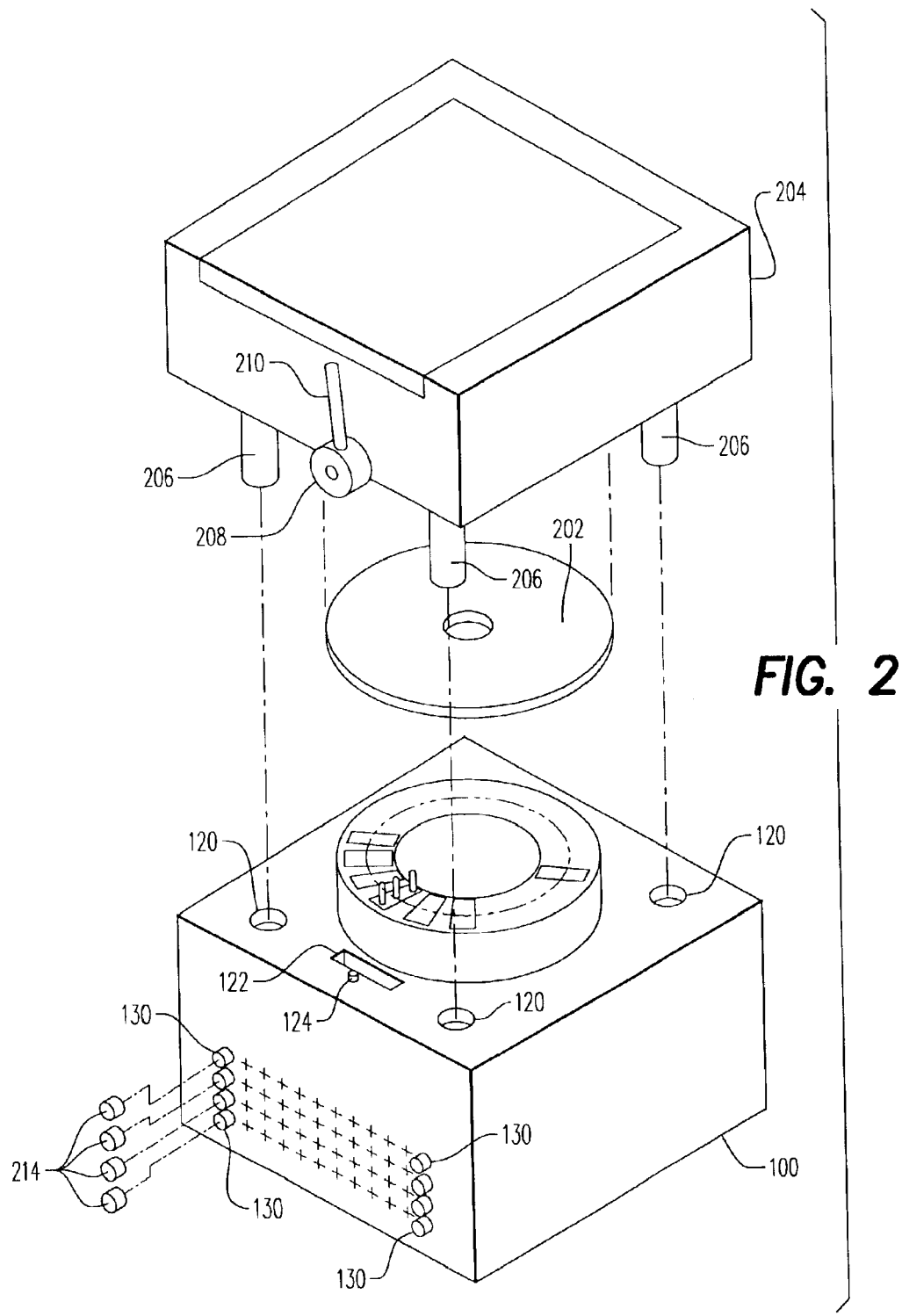
FIG. 2 is an exploded drawing showing the method of mounting a probe card on the connection box shown in FIG. 1.

The evaluation system 300 using a measuring device and connection box involves mounting the fixture 204 with the probe card 202 attached on the connection box 100, explained in FIGS. 1 and 2; the measurement channel terminals 304 to 310 of the measuring device 302 are connected with the connectors 130 of the desired channels. Furthermore, short-circuiting caps 214 are connected to the connectors 130 which are not connected to the measuring device, so that the precise measurements are not affected.

The measuring device 302 may be, for example, an Agilent 4156 parametric analyzer; this device is provided with four channels of SMU's, which is a programmable device with a voltage applying and current measuring function (with a current-limiting function added) and a current applying and voltage measuring function (with a current limiting function added). Another example is the Agilent 4339 insulation resistance meter, or other ammeter/voltmeters which can measure resistances. Furthermore, other short-circuiting means can be used instead of the short-circuiting caps.

The flow chart of the measurements in this evaluation system will be explained by using FIG. 4. First, a DUT board or probe card 202 is mounted on the connection box 100 (step 404); the desired connectors 130 of the connection box 100 and the measuring device 302 are connected by using cables 312 to 318 (step 406); the short-circuiting caps 214 are placed on the connectors 130 which are not connected (step 408); and the evaluative measurements of the probe card 202 are performed with the measuring device 302 (step 410). Various measurements can be made, e.g., the current values when 0 V and 100 V are applied can be measured in four channels and evaluated; the number of measurement channels can be increased or decreased, measurements can be performed under other conditions, measurements can be performed by other methods, such as insulation resistance meters, and measurements using adjacent channels can also be performed.

Next, in step 412, it is judged whether all of the connectors connected to the probe card 202 were measured, and if some conductors remain, one can return to step 406 and repeat the measurements. If all of the connectors have been measured, one proceeds to step 416, in which the test results of this probe card are determined from the measured values. These results are used to judge whether retesting is necessary in step 416, and if retesting is necessary, one returns to step 406 and repeats the measurements. If it is judged that no retesting is needed, the measurements on this probe card are completed.

As can be seen from this flow chart, the probe card is kept mounted on the connection box from the measurements of all the pads of the probe card until the judgment about the necessity of retesting is performed; therefore, even if it is necessary to retest several times, the pads of the probe card are only mounted once. Therefore, abrasion of the pads, which have a limited mounting life-time, can be reduced in the evaluation testing, which is advantageous. Moreover, retesting formerly required as much trouble as the first evaluation, but with this invention it can be performed easily with the probe card still mounted, and reproducible retesting results can be obtained.

Figure 5:
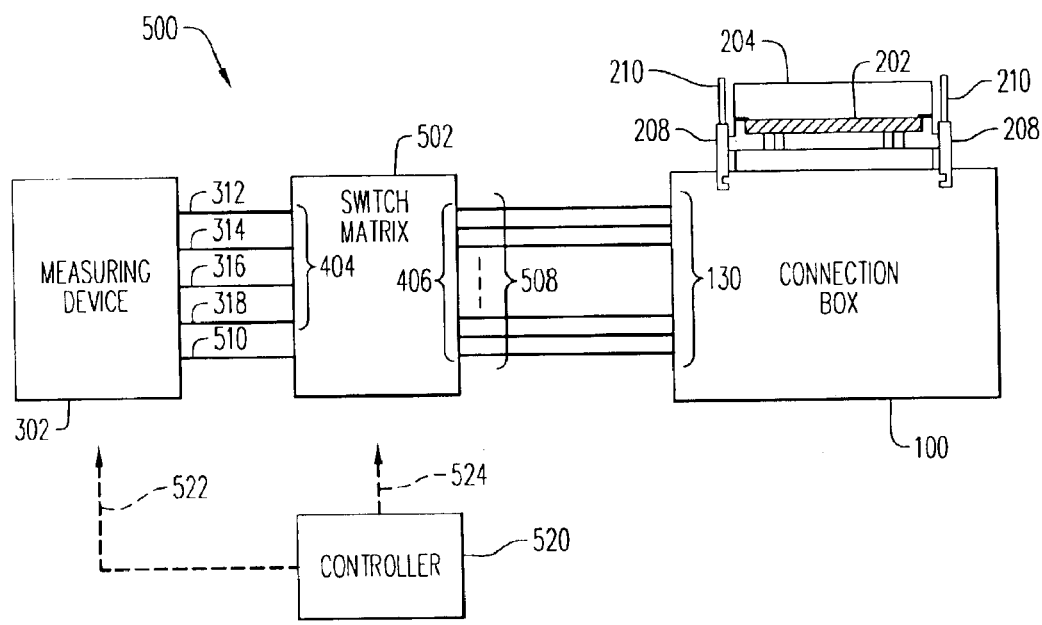
FIG. 5 is a block drawing of an evaluation system which is another working embodiment of this invention.

Next, another working embodiment of this invention will be explained by using FIGS. 5 and 6. The evaluation system 500 shown by FIG. 5 is one in which a switch matrix 502 is connected between the connection box 100, with the probe card 202 mounted on it, and the measuring device 302. All the channels of the measuring device 302 are connected to the switch matrix 502 output terminals 404 through cables 312 to 314. The measuring device 302 and the switch matrix 502 are also connected by the control line 510, so that the measuring device 302 can control the switch matrix 502. Furthermore, the input terminals 406 of the switch matrix 502 and the connectors 130 of the connection box 100 are connected by the cables 508. The desired terminals on the input side of the switch matrix 502 and the desired terminals on the output side are connected by controls from the measuring device 302. Furthermore, if it is not necessary to measure with all of the connectors 130, because of the particular probe card being measured or the range of necessary measurements, some of the connectors 130 can be disconnected from the input side terminals 406.

Figure 6:
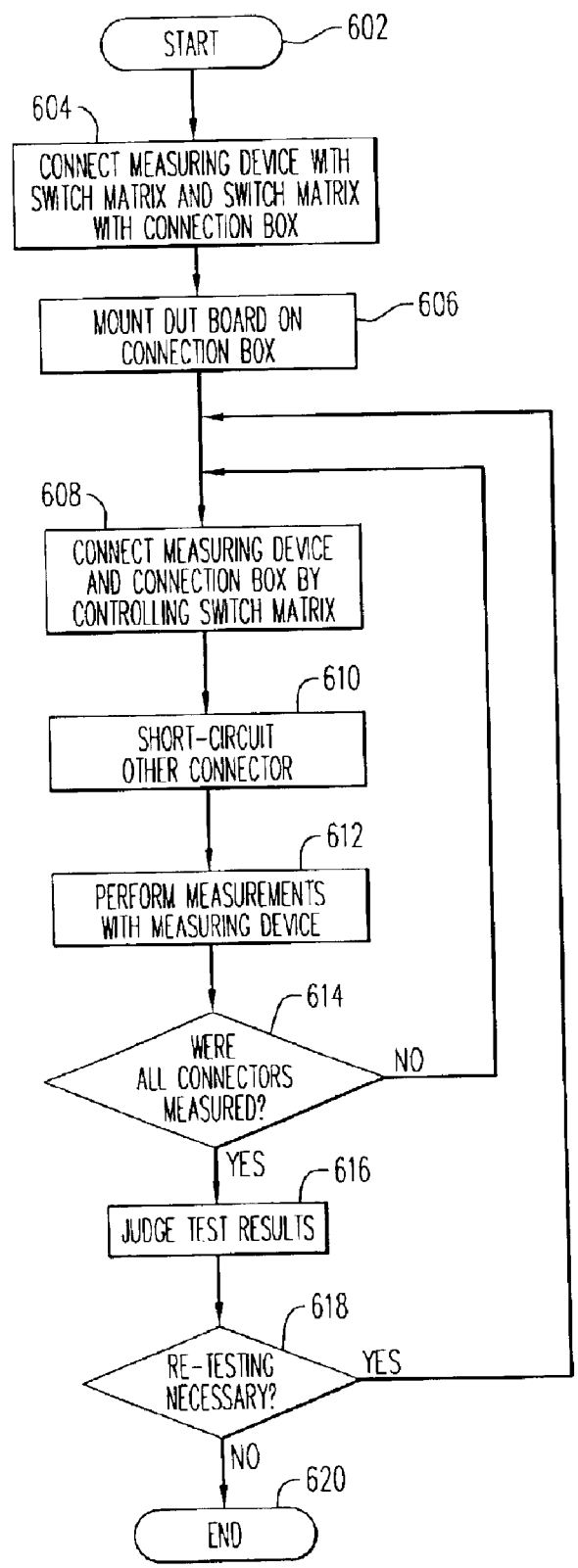
FIG. 6 is flow chart which shows the measurement method in the evaluation system shown in FIG. 5.

FIG. 6 shows a flow chart of the measurements performed with this evaluation system. First, in step 604, the measuring device 302 and the switch matrix 502, as well as the switch matrix 502 and the connection box 100, are connected. Next, the DUT board, i.e., in this case, the probe card 202, is mounted on the connection box 100 (step 606), the desired connections between the measuring device 302 and the connection box 100 are made by controlling the switch matrix 502 (step 608), and the connectors not connected to the measuring device 302 are connected so that they are short-circuited, also by controlling the switch matrix 502 (step 610). For example, 0 V is outputted to the output terminals 404 connected to the measuring device 302 which are not being used in the measurement, and the input terminals 406 of the switch matrix which are not connected to the measuring device are connected to them and short-circuited. Next, in step 612, the measurements are performed with the measuring device 302. The nature of the measurements is the same as in FIG. 4; therefore, it will not be explained here.

Next, in step 614, it is judged whether all of the connectors connected to the probe card 202 have been measured; if any connectors are left, one returns to step 608 and repeats the measurements, and if all of the connectors are finished, one proceeds to step 616. The test results for this probe card are judged, based on the measured values, and a judgment about whether retesting is necessary is made as a result in step 618; if retesting is necessary, one returns to step 608 and repeats the measurements. If no retesting is necessary, the measurements of this probe card are completed.

Figure 4:
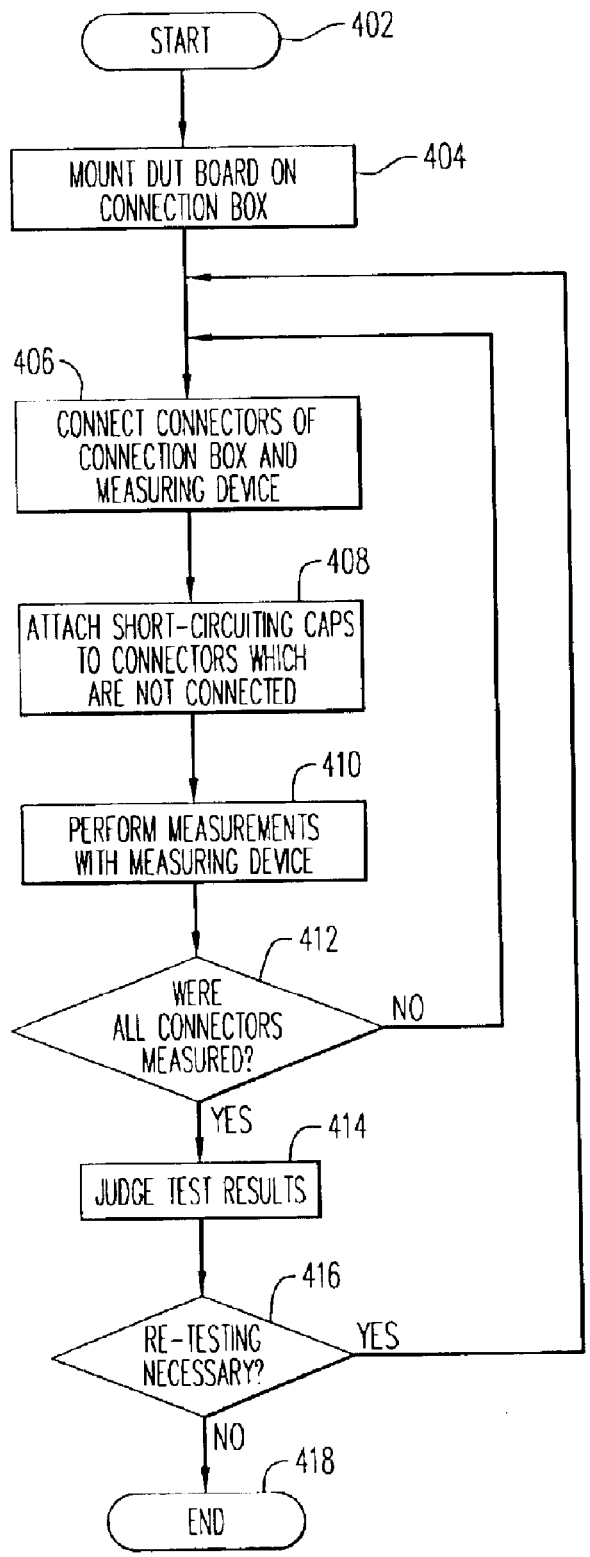
FIG. 4 is a flow chart which shows the measurement method in the evaluation system shown in FIG. 3.

As explained concerning FIG. 4, the process of the flow chart of FIG. 6 also contributes to reducing the abrasion of the pads of the probe card in the evaluation tests, and the advantages concerning retesting are also the same.

Moreover, by using the measurement system used in FIG. 5, the operator can indicate to the switch matrix which connections are to be made from the measuring device, with a manual operation, and perform the measurements. Therefore, one can easily perform trial test operations on any desired pads of the DUT board, and analyze any undesirable occurrences.

In addition, a controller 520, such as a personal computer, can be added, as shown by the control line 522 between the controller 520 and the measuring device 302, and the control line 524 to the switch matrix 502, and the measurements can be performed according to the flow chart of FIG. 6 by controlling the measuring device 302 and the switch matrix 502 from the controller 520.

Working embodiments of this invention were explained above by using a probe card as an example, but essentially the same explanation could be made by substituting a DUT board for the probe card; therefore, this invention also includes a technology for evaluating DUT boards.

As explained above, it is possible to increase the reproducibility of the measurement results in evaluating DUT boards by using this invention. Furthermore, this invention also makes it possible to reduce the abrasion of the pads in the evaluation tests. In addition, the operating time used by the operator to make the connections in the evaluation tests is reduced. Moreover, retesting can be performed easily, and data with good reproducibility can be obtained. In addition, evaluation of DUT boards by measuring very small currents on the order of fA can also be performed by attaching a fixture, so that the effects of dirt and external noise can be eliminated. Furthermore, one can easily perform trial test operations on any desired pads of the DUT board, and analyze any undesirable occurrences, by means of an evaluation system for DUT boards in which a switch matrix is connected. Moreover, since the pads of any desired channels of the DUT board can be kept at a constant potential by short-circuiting means such as short-circuiting caps, one can prevent noise from being mixed with the measurement channels and measurements can be performed with high accuracy and good reproducibility.

What is claimed is:

1. A connection box comprising:
   a plurality of contact pins corresponding to a plurality of contact terminals provided on a DUT board;
   a mounting mechanism for mounting said DUT board; and
   a plurality of connectors connected to said plurality of contact pins, wherein said connectors are triaxial connectors having outer conductors that are grounded.

2. A connection box in accordance with claim 1, further comprising a fixture which covers the top of said DUT board.

3. A connection box in accordance with claim 1, further comprising Kelvin connections disposed between said connectors and said contact pins.

4. A connection box in accordance with claim 1, further comprising a plurality of short-circuiting devices for selectively short-circuiting said connectors.

5. A connection box in accordance with claim 1, wherein said DUT board is a probe card.

6. A connection box comprising:
   a plurality of contact pins corresponding to a plurality of contact terminals provided on a DUT board;
   a mounting mechanism for mounting said DUT board; and
   a plurality of connectors connected to said plurality of contact pins, wherein said connectors and said contact pins are connected by a plurality of triaxial cables.

7. A system for evaluating DUT boards comprising:
   a connection box comprising:
   a plurality of contact pins corresponding to contact terminals of a DUT board;
   a mounting mechanism for mounting said DUT board; and
   a plurality of connectors connected to said plurality of contact pins and a measuring device connected to at least one of said connectors that measures and evaluates said DUT board mounted on said connection box, wherein said connectors are triaxial connectors having outer conductors that are grounded.

8. The system for evaluating of claim 7, further comprising a plurality of short-circuiting devices for short-circuiting said connectors not connected to said measuring device.

9. The system for evaluating of claim 7, further comprising a switch matrix disposed between said connection box and said measuring device, wherein said switch matrix is controlled from said measuring device.

10. The system far evaluating of claim 7, further comprising:
    a switch matrix disposed between said connection box and said measuring device; and
    a controller for controlling said measuring device and said switch matrix.

11. The system for evaluating of claim 7, wherein said measuring device has the capability of applying voltages and measuring currents.

12. The system for evaluating of claim 7, wherein said measuring device has the capability of measuring voltage-current characteristics.

13. The system for evaluating of claim 7, wherein said measuring device includes a SMU.

14. The system for evaluating of claim 7, wherein said measuring device has the capability of measuring insulation resistance.

15. The system for evaluating of claim 7, wherein said DUT board is a probe card.

16. A system for evaluating DUT boards comprising:
    a connection box comprising:
    a plurality of contact pins corresponding to contact terminals of a DUT board;
    a mounting mechanism for mounting said DUT board; and
    a plurality of connectors connected to said plurality of contact pins and a measuring device connected to at least one of said connectors that measures and evaluates said DUT board mounted on said connection box, wherein said connectors and said contact pins are connected by a plurality of triaxial cables.

* * * * *